United States Patent [19]

Parekh et al.

[11] 4,249,700
[45] Feb. 10, 1981

[54] RECOVERY OF SILICON CARBIDE WHISKERS FROM COKED, CONVERTED RICE HULLS BY LIQUID-LIQUID SEPARATION

[75] Inventors: Bhupendra K. Parekh; William M. Goldberger, both of Columbus, Ohio

[73] Assignee: Exxon Research & Engineering Co., Florham Park, N.J.

[21] Appl. No.: 53,738

[22] Filed: Jul. 2, 1979

[51] Int. Cl.$^3$ .............................................. B02C 23/00
[52] U.S. Cl. ....................................... 241/24; 209/3; 209/162; 209/171; 423/346
[58] Field of Search ................... 209/3, 171, 172, 207, 209/162–164, 5; 241/20, 24; 209/5; 423/345, 346

[56] References Cited

U.S. PATENT DOCUMENTS

| | | | |
|---|---|---|---|
| 386,504 | 7/1888 | Sweanor | 209/172 |
| 766,289 | 8/1904 | Schwarz | 209/171 |
| 1,377,937 | 5/1921 | Spearman | 209/207 X |
| 2,165,607 | 7/1939 | Blow | 209/172 |
| 2,296,368 | 9/1942 | Ralston | 209/207 |
| 2,310,964 | 2/1943 | Laughlin | 209/5 |
| 2,553,444 | 5/1951 | Dunn | 209/3 X |
| 2,686,592 | 8/1954 | Miller | 209/172 X |
| 3,243,284 | 3/1966 | Morelock | 75/81 |
| 3,268,071 | 8/1966 | Puddington | 209/5 |
| 3,349,909 | 10/1967 | Studer | 209/172 X |
| 3,439,801 | 4/1969 | Morris | 209/5 |
| 3,462,262 | 8/1969 | Koch | 75/33 |
| 3,665,066 | 5/1972 | Capes | 264/117 |
| 3,754,076 | 8/1973 | Cutler | 423/345 |
| 3,758,672 | 9/1973 | Lewis | 423/345 |
| 3,764,007 | 10/1973 | Schmid | 209/211 |
| 3,806,044 | 4/1974 | Rosar | 209/164 X |
| 3,836,356 | 9/1974 | Irani | 75/33 |
| 3,865,315 | 2/1975 | Roberts | 241/4 |
| 3,920,446 | 11/1975 | Irani | 75/51 |
| 4,060,412 | 11/1977 | Divecha | 75/203 |

FOREIGN PATENT DOCUMENTS

| | | |
|---|---|---|
| 8614 | of 1912 United Kingdom | 209/171 |
| 521883 | 6/1940 United Kingdom | 209/172 |

OTHER PUBLICATIONS

Trans. Inst. Min. Metal vol. 75, 1966 pp. C267–C268, Mellgren et al.
Trans. Soc. of Min. Engineers, AIME vol. 241, Dec. 1968, pp. 549–556, Lai et al.
Can. J. of Chem. Eng., Apr. 1961, pp. 94–97, Farnard et al.
Mineral, Sc. Eng., vol. 7, No. 3, Oct. 1975, Puddington et al.

*Primary Examiner*—Robert Halper
*Attorney, Agent, or Firm*—K. P. Glynn; R. S. Salzman

[57] ABSTRACT

The present invention is directed to silicon carbide whisker recovery from a mixture of silicon carbide whiskers and carbonaceous silicon carbide particles. The invention involves shredding the mixture down to a specified size, dispersing the mixture in water to form an aqueous mixture, agitating the aqueous mixture, mixing the aqueous mixture with an immiscible organic solvent which is lighter than water, agitating the resulting water-organic solvent mixture, allowing the organic solvent and its contents to rise above the water and its contents, separating the two liquid phases into an organic solvent phase and an aqueous phase and, lastly, performing a solid-liquid separation on each of the two phases, thereby obtaining from the aqueous solution the desired silicon carbide whiskers and obtaining from the organic solvent solution a carbonaceous silicon carbide particle product.

11 Claims, 1 Drawing Figure

RECOVERY OF SILICON CARBIDE WHISKERS FROM COKED, CONVERTED RICE HULLS BY LIQUID-LIQUID SEPARATION

BACKGROUND OF THE INVENTION

1. Field of the Invention

The present invention is directed to a method of recovering silicon carbide whiskers from a mixture of silicon carbide whiskers and carbonaceous silicon carbide particles. More particularly, the present invention is directed to such recovery by using a series of specified steps including liquid/liquid separation.

2. Prior Art

Silicon carbide whiskers have in recent years been found to be particularly useful for reinforcing metal and other composite materials so as to enhance the physical properties thereof. Thus, for example, U.S. Pat. No. 4,060,412 to A. P. Divecha describes the use of microscopic silicon carbide fibers in a mixture with metal particles so as to be randomly oriented, and the subsequent extrusion and casting to form very high strength composite material billets.

Silicon carbide whiskers may be produced using elemental materials such as is described in U.S. Pat. No. 3,758,672 wherein solid phase carbon and solid phase silicon are heated to specified temperatures in a hydrogen and chlorine atmosphere to form silicon carbide whiskers on a substrate. Alternatively, silicon carbide whiskers have been produced from natural materials such as is described in U.S. Pat. No. 3,754,076 wherein the silicon carbide whiskers are formed from the silica and the carbon which are naturally present in rice hulls. Each technique has its advantages and disadvantages. However, the method of producing silicon carbide from rice hulls appears to be more advantageous in that it is a method whereby one of the most abundant waste materials in the world is consumed. Nonetheless when rice hulls are used as a starting material for the production of silicon carbide whiskers, a substantial amount of non-whisker residual material remains and an area of developing interest involves the separation of the silicon carbide whiskers from the other residual materials. To date, it is believed that relatively well-known mechanical screening and sifting means have been employed, with minimum success, to separate the silicon carbide whiskers from residual materials when formed from rice hulls.

Although the prior art is replete with many techniques for separating various solid materials from one another, it is believed that the method of the present invention employing a liquid/liquid separation as well as other necessary steps, has not heretofore been contemplated or rendered obvious. Exemplary of the prior art is U.S. Pat. No. 3,243,284, which describes a method for collecting metal whiskers. This patent describes a process wherein the metal whisker growth substrate is immersed in mercury and wherein the mercury and substrate are vibrated and a liquid is added to the mercury which is non-reactive with respect to the whiskers and which is mixed with the mercury to transport the whiskers from the mercury into the liquid, followed by filtering. While this patent describes a liquid/liquid separation of metal whiskers, it is not directed to the use of such a process for separation of silicon carbide whiskers prepared from rice hulls from non-whisker residual materials, and, furthermore, is not directed to such a technique in which water is employed. U.S. Pat. No. 3,439,801 is directed to a process for removing discoloring impurities which may be organic or graphitic in nature from a clay slip. The method described in this patent involves intimately contacting an aqueous slip of fine milled clay with a water insoluble, non-ionizable organic liquid and thereupon recovering the clay from the separated clay water base. The organic liquid is the sole chemical reagent necessary for the effective separation of the discoloring impurities from the fine milled clay in the slip. While this patent is directed to a liquid/liquid separation technique involving the use of water and a water insoluble non-ionizable organic liquid, it is not directed to the separation of whisker materials from other solids, much less the separation of silicon carbide whiskers made from rice hulls.

U.S. Pat. No. 3,462,262 describes a process for the recovery of excess carbon from the product of an iron ore direct reduction process. The method involves treating the iron ore containing the carbon with oil followed by flotation in water. U.S. Pat. No. 3,764,007 is directed to the separation of solid particles from solid particles having a different shape. The invention therein is directed to a process for such a separation using a suspension, without turbulence, at a specified velocity profile using rotary movement of two discs. U.S. Pat. No. 3,865,315 is directed to a process for separating fibrous material such as wool fiber from mixtures of fibrous material and adhered shot without substantially destroying the fiber length. This method involves passing a water suspension of the fibrous material and adhered shot through an attrition device to gently abrade the fiber shot interface, then diluting the abraded mixture with water, agitating the diluted mixture, and decanting to separate the substantially unbroken fibers from the now separated shot. While this patent is directed to removing fibrous material from shot material, it does not employ a liquid/liquid separation technique but rather relies ultimately upon gravity for removal of the shot.

U.S. Pat. No. 3,920,446 is directed to a method for treating siliceous materials to form silicon carbide for use in refining ferrous material. The method involves heating mixtures of SiC and iron product at elevated temperatures comminuting the resulting product from the heat treatment and separating the metallic iron from the silicon carbide magnetically. U.S. Pat. No. 3,836,356 is also directed to a process wherein metal iron is removed from silicon carbide residue magnetically. U.S. Pat. No. 3,665,066 is directed to beneficiation of coals using liquid agglomeration techniques and U.S. Pat. No. 3,268,071 is likewise directed to a process for the agglomeration of solids by agglomeration using liquid/liquid techniques. U.S. Pat. No. 4,118,464 is directed to a process for separating silica from silicate bearing materials and includes discussion of the formation and separation of silicon carbide from such materials. It is disclosed that the silicon carbide fibers obtained by the process may be separated by a suitable conventional mechanical screen process at which time there may be obtained an excellent separation of the silicon carbide from a carbon matrix residue and other materials. While this patent is directed to separation of silicon carbide from carbonaceous mateials, it does not describe the use of a liquid/liquid separation technique.

Lastly, O. Mellgren et al, *Trans. Inst. Min. Metall.*, Vol. 75, 1966, pp. C267–C268, describe a method for recovering ultrafine mineral particles by extraction with an organic phase and an aqueous phase. R. W. M. Lai et al, *Transactions of Society of Mining Engineers, AIME*, Vol. 241, December, 1968, pp. 549–556, describe liquid/liquid extraction of ultrafine particles using water-oil separation, and J. R. Farnand et al, *The Canadian Journal of Chemical Engineering*, April, 1961, pp. 94–97, describe spherical agglomeration of solids in liquid suspension. I. E. Puddington et al, in *Minerals Science Engineering*, Vol. 7, No. 3, October, 1975, describe spherical agglomeration processes and include a discussion on mineral beneficiation using liquid techniques.

In summary, of all the prior art described herein, there is no teaching of the present invention nor is there any teaching that would render the present invention obvious.

BRIEF DESCRIPTION OF THE INVENTION

The present invention is directed to silicon carbide whisker recovery from a mixture of silicon carbide whiskers and carbonaceous silicon carbide particles. The invention involves shredding the mixture down to a specified particle size in order to liberate the silicon carbide whiskers from the carbonaceous silicon carbide particles, dispersing the shredded mixture in water to form an aqueous mixture of hydrophilic silicon carbide whiskers and hydrophobic carbonaceous silicon carbide particles, agitating the aqueous mixture to further liberate said hydrophilic silicon carbide whiskers from said hydrophobic carbonaceous silicon carbide particles, mixing the aqueous mixture with an immiscible organic solvent which is lighter than water and which will have an affinity for said hydrophobic carbonaceous silicon carbide particles, agitating the resulting water-organic solvent mixture, allowing the organic solvent and its contents to rise above the water and its contents, separating the two liquid phases into an organic solvent phase and an aqueous phase, and, lastly, performing a solid-liquid separation on each of the two phases, thereby obtaining from the aqueous solution the desired silicon carbide whiskers. The carbonaceous silicon carbide particle product can also be recovered from the reagent solution.

DETAILED DESCRIPTION OF THE PRESENT INVENTION

Figure 1:
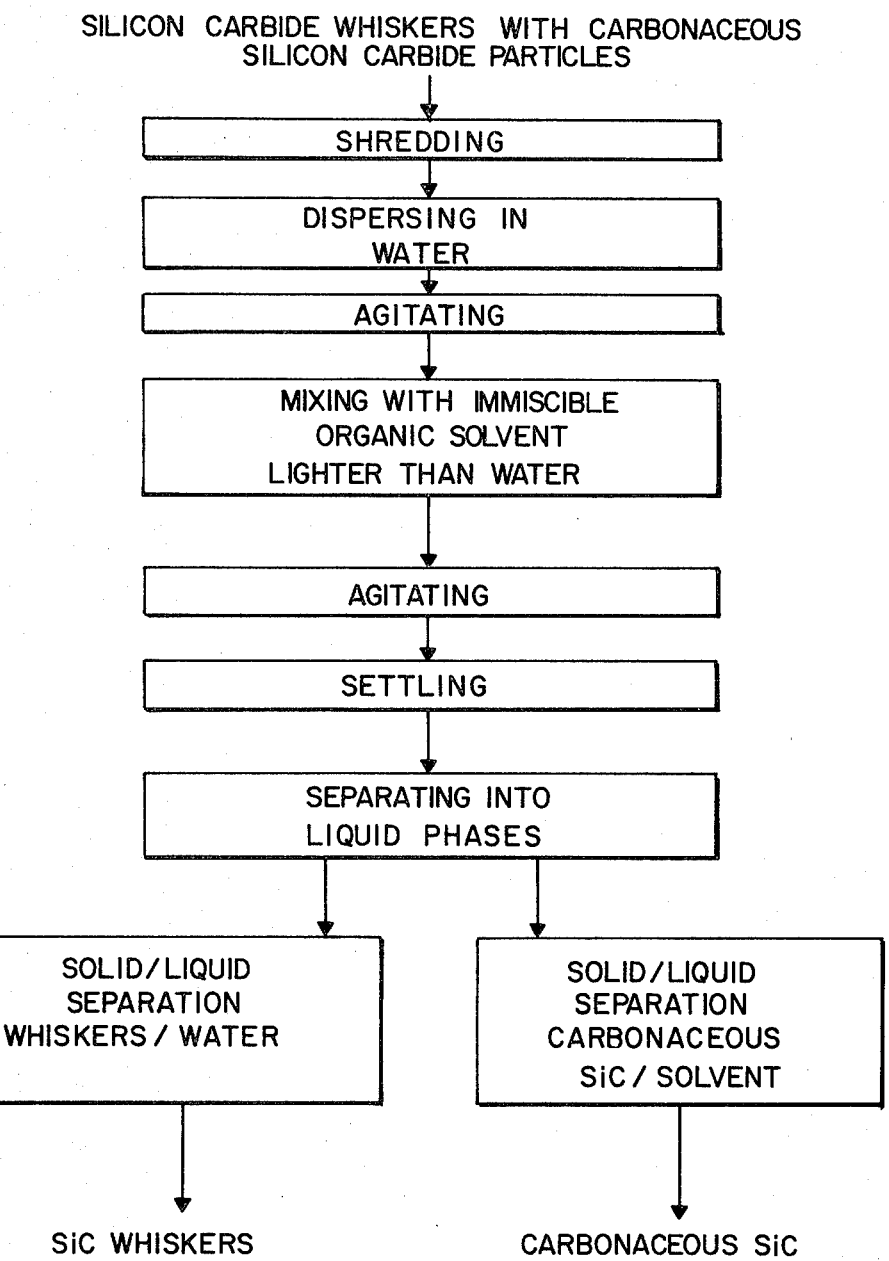
FIG. 1 shows a flow diagram on a step-by-step basis of the method of the present invention for the separation and recovery of silicon carbide whiskers from a mixture of silicon whiskers and carbonaceous silicon carbide particles.

Silicon carbide may be formed by conversion of rice hulls at elevated temperatures under selected atmospheric conditions as described in the prior art above. The resulting silicon carbide whiskers, formed from the silica and the carbon content of the rice hulls, also contain non-whisker silicon carbide and unreacted carbon or coke material. In view of the fact that less than all of the silicon carbide produced is whisker-like, it has been recognized that silicon carbide whiskers and silicon carbide particles are both hydrophilic and that, therefore, liquid-liquid separation techniques employing water as one of the media would not be effective. Thus, for example, one technique which may be used for separating the whiskers from the silicon carbide non-whisker particles and the carbonaceous material involves burning off the carbonaceous material at very high temperatures, and then removing the silicon carbide particles from the silicon carbide whiskers by mechanical means. However, this technique had a minimum success.

It has now been discovered that silicon carbide whiskers which are grown from rice hulls are formed into a natural mat of the whiskers and silicon carbide particles and carbonaceous material and, most importantly, that the silicon carbide particles are either coated with or otherwise connected to the carbonaceous materials. It has further been discovered that controlled shredding of the mat without excess pressure and without harsh milling will break up the fibrous mat, liberating whiskers and without removing the carbonaceous coating from the silicon carbide particles. The clean silicon carbide whiskers are naturally hydrophilic and the carbonaceous coated silicon carbide was found to be hydrophobic. By using these unique characteristics of the materials, aqueous liquid/liquid separation may be effected. Thus, the present invention is directed to a method of separating silicon carbide whiskers from carbonaceous silicon carbide particles.

The method of the present invention involves first shredding the silicon carbide whiskers and carbonaceous silicon carbide so as to break up the fibrous mat which is naturally formed in the silicon carbide whisker growing process. This shredding step may advantageously be performed using a hammer mill shredder or its equivalent. In fact, any shredder may be employed provided that the carbonaceous silicon carbide particles contained in the mixture which is being worked on are not broken up so as to separate the carbonaceous material from the silicon carbide particles. (Whether or not a particular shredding technique would be detrimental to the carbonaceous silicon carbide particles may be determined by micrographic inspection or, alternatively, by following the process of the present invention to determine whether or not it is effective.)

Shredding of the mat containing the silicon carbide whiskers and the carbonaceous silicon carbide particles should be performed until a maximum particle size of −10 mesh, and preferably −5 mesh, is obtained. In addition to shredders, apparatus such as screens may be employed. While screening is optional and the specified size particles may be obtained with shredders such as a hammer mill, screening provides an excellent quality control mechanism. In either case, the shredding is essential to the method of the present invention. Thus, it is by this shredding down to the specified size that a partial liberation of the whiskers from the carbonaceous silicon carbide particles is effected without detrimentally harming the integrity of the carbonaceous silicon carbide particles which remain with the whiskers.

The next step in the method of the present invention involves dispersing the shredded silicon carbide whisker-carbonaceous silicon carbide particle mixture in water. In general, dispersion in water is carried out so as to yield a solution of about 1 to about 15% by weight of solids and preferably from about 5 to about 10% by weight of these solids. If desired, optional dispersing agents such as sodium pyrophosphate, sodium metaphosphate and sodium silicate may be employed. Of these, a preferred dispersing agent is sodium silicate.

After the materials are dispersed in water, the resulting mixture is subjected to agitation. This agitation enhances the final liberation of the silicon carbide whiskers from the carbonaceous silicon carbide particles and the dispersion thereof in the water. The agitation may be carried out by using ultrasonics, by a mechanical blender technique using, for example, a Waring blender, or the materials may otherwise be agitated by a mechanical agitator or any other type of agitator which will not harm the integrity of the carbonaceous silicon carbide particles and the whiskers.

After agitation, the aqueous mixture is combined with an immiscible hydrocarbon liquid which is ligher than water. Any such hydrocarbon liquid may be employed which will preferentially wet carbon surface, including kerosene, mineral spirits, light fuel oils and the like. In general, a ratio of about one part by volume of organic solvent to about 5 parts of aqueous dispersion up to a ratio of about 1 part by volume of organic solvent to about 30 parts by volume of aqueous dispersion may be employed. Within this range, a ratio of 1 part by volume of organic solvent to about 5 parts by volume of aqueous dispersion up to about 1 part by volume of organic solvent to about 20 parts by volume of aqueous dispersion is preferred.

After the immiscible organic solvent and the aqueous dispersion are mixed, agitating is again employed. This agitation may involve stirring or shaking or any other agitation technique which will effectively cause the organic solvent and the water to substantially intermingle.

After this agitation, the two liquids are allowed to settle. The hydrocarbon liquid layer rises out on top of the water layer and contains the hydrophobic carbonaceous silicon carbide particles, whereas the water layer at the bottom contains clean silicon carbide whiskers.

The two liquid phases are next separated from one another, e.g., by decantering, and then the solids are respectively separated from their liquids by known liquid/solid techniques whereby the water solution and the silicon carbide whiskers contained therein are separated from one another, and whereby the hydrocarbon liquid and the carbonaceous silicon carbide particles contained therein are separated from one another.

The foregoing steps employed in the method of the present invention are shown in the form of a block flow diagram in the attached drawing.

Equivalent and alternative steps to those described specifically above should now be apparent to the artisan without exceeding the scope of the present invention. The present invention is more fully illustrated by the following examples.

EXAMPLES 1 and 2

Converted rice hull silicon-carbide-containing product as obtained from an induction furnace was found to consist of a mat which could not be dispersed as such in water. Photomicrographs of the coked and converted rice hulls showed carbonaceous silicon carbide particles embedded loosely in a mat of silicon carbide whiskers. Because the carbonaceous silicon carbide particles and the whiskers appeared to be loosely attached, it was considered feasible to disperse the converted material in water and subsequently separate the liberated silicon carbide whiskers from the carbonaceous hulls by virtue of the difference in surface properties of the two materials. Thus, it was assumed that the silicon carbide particles containing the carbonaceous material thereon would act as if it were carbon and be hydrophobic. The silicon carbide whiskers which contained little or no carbonaceous material were assumed to be hydrophilic. Since, as mentioned, the mat obtained from the induction furnace could not be dispersed as such in water, the material was shredded in a hammer mill shredder and subsequently worked so as to pass through a five mesh (0.15") screen. This shredded material was used for the liberation and dispersion of the silicon carbide. Next, about one gram of material was dispersed in approximately 200 cc of water. Agitation was effected with an ultrasonic device which consisted of a horn attached to an ultrasonic transducer driven by an ultrasonic generator. The horn was submerged in the aqueous suspension and operated to produce vibrations of about 20,000 hertz using approximately 100 watts of power for a period of about 5 minutes. At the end of this agitation, the material appeared to be completely liberated and dispersed. However, separation studies conducted on this type of suspension showed that a substantial amount of submicron size carbonaceous silicon carbide particles remained present with the whisker product. Thus, it was recognized that further separation would be required.

As an alternative to the ultrasonic device, a Waring blender was used to agitate one gram of the mat in 500 cc of water for a period of about two minutes. The blender was operated at a minimum speed of about 3,000 rpm. Separation studies conducted on this dispersed material indicated that the length of the whiskers was slightly shortened. It was concluded that, while this agitation technique could be used, it was not as advantageous as ultrasonics and, that further separation would be required.

As a second alternative, an agitator machine was used for liberation studies which consisted of a spiral of horizontal blades. This agitator device was attached to a mechanism whereby the revolutions per minute of impact could be controlled. For this study, approximately 50 grams of shredded material were placed in 500 cc of water and agitated at 700 rpm for about 5 minutes. The whiskers in the dispersed suspension appeared liberated to a great degree without any change in their length.

Shredded silicon carbide whiskers with carbonaceous silicon carbide particles which had been worked through a five mesh screen were dispersed in water and agitated so as to produce a dispersion of about one gram of shredded material to 50 cc of water. It was then transferred into a separatory funnel and 25 cc of mineral spirits were added to it. The oil-water-solid mixture in the funnel was then agitated by shaking vigorously for about one minute. On leaving the separatory funnel undisturbed for about two minutes, a top layer of mineral spirits containing black color particles formed, and a bottom aqueous layer containing light grayish-colored material formed. Each layer was then separated and filtered. The filter cakes so obtained were dried and weighed to determine the weight of solids present in each phase. This technique was repeated a second time and the results are shown in Table 1 below. The dried products were examined with a scanning electron microscope and it was found that the mineral spirits phase solids consisted of discrete silicon carbide hulls coated with carbon whereas the aqueous phase solids consisted of silicon carbide whiskers only.

TABLE 1

| LIQUID-LIQUID PHASE SEPARATION OF COKED, CONVERTED RICE HULLS | | | | |
|---|---|---|---|---|
| Example | Phase | Wt. % (grams) | Wt. % | Remarks |
| 1 | Oil | 0.49 | 81.0 | Hulls, no |

TABLE 1-continued

LIQUID-LIQUID PHASE SEPARATION OF COKED, CONVERTED RICE HULLS

| Example | Phase | Wt. % (grams) | Wt. % | Remarks |
|---|---|---|---|---|
| | Aqueous | 0.11 | 19.0 | whiskers Whiskers, no hulls |
| 2 | Oil | 0.17 | 77.0 | Hulls, no whiskers |
| | Aqueous | 0.05 | 23.0 | Whiskers, no hulls |

What is claimed is:

1. A method for separating silicon carbide whiskers from a mixture of silicon carbide whiskers with carbonaceous silicon carbide particles, comprising:
   (i) shredding the mixture down to a specified particle size in order to liberate the silicon carbide whiskers from the carbonaceous silicon carbide particles;
   (ii) dispersing the shredded mixture in water to form an aqueous mixture of hydrophilic silicon carbide whiskers and hydrophobic carbonaceous silicon carbide particles;
   (iii) agitating the aqueous mixture to further liberate said hydrophilic silicon carbide whiskers from said hydrophobic carbonaceous silicon carbide particles;
   (iv) mixing the aqueous mixture with an immiscible organic solvent which is lighter than water and which will have an affinity for said hydrophobic carbonaceous silicon carbide particles;
   (v) agitating the aqueous mixture and organic solvent;
   (vi) settling the aqueous mixture and organic solvent so as to establish two liquid phases;
   (vii) separating the two liquid phases; and,
   (viii) separating the silicon carbide whiskers from the aqueous mixture.

2. The method of claim 1 wherein said organic solvent is selected from the group consisting of kerosene, mineral spirits and light fuel oils.

3. The method of claim 1 wherein said organic solvent is mixed with said aqueous mixture in a volume ratio of about 1 to 5 up to about 1 to 20.

4. The method of claim 1, wherein the carbonaceous silicon carbide non-whisker particles are obtained by separating said particles from the organic solvent.

5. The method of claim 1 wherein said shredded mixture is dispersed in water so as to contain about 1 to about 15% by weight of solids.

6. The method of claim 5 wherein said shredded mixture is dispersed in water so as to contain about 5 to about 10% by weight of solids.

7. The method of claim 1 or 5 wherein said organic solvent is mixed with said aqueous mixture in a volume ratio of about 1 to 5 up to about 1 to 30.

8. The method of claim 1, 5, 2, 6, or 3 wherein said shredding is accomplished with a hammer mill.

9. The method of claim 1, 5, 2, 6, or 3 wherein said liquid phase separation is accomplished by decanting.

10. The method of claim 1, 5, 2, 6, or 3 wherein said shredding was performed so as to render a particle size of minus ten mesh.

11. The method of claim 1, 5, 7, 2, 6, or 3 wherein said shredding was performed so as to render a particle size of minus five mesh.

* * * * *